United States Patent [19]
Knauer et al.

[11] Patent Number: 5,808,475
[45] Date of Patent: Sep. 15, 1998

[54] SEMICONDUCTOR PROBE CARD FOR LOW CURRENT MEASUREMENTS

[75] Inventors: William Knauer, Chagrin Falls; Robert Bennett, Mantua, both of Ohio

[73] Assignee: Keithley Instruments, Inc., Cleveland, Ohio

[21] Appl. No.: 660,441

[22] Filed: Jun. 7, 1996

[51] Int. Cl.[6] .................................................. G01R 1/04
[52] U.S. Cl. ............................................ 324/762; 324/754
[58] Field of Search ............................ 324/72.5, 754, 324/755, 761, 762; 439/482, 824

[56] References Cited

U.S. PATENT DOCUMENTS

| | | | |
|---|---|---|---|
| 3,866,119 | 2/1975 | Ardezzone et al. | 324/72.5 |
| 4,056,777 | 11/1977 | Roch | 324/762 |
| 4,488,111 | 12/1984 | Widdowson | 324/762 |
| 4,518,914 | 5/1985 | Okubo et al. | 324/762 |
| 4,899,106 | 2/1990 | Ogura . | |
| 4,983,907 | 1/1991 | Crowley . | |
| 5,345,170 | 9/1994 | Schwindt et al. . | |
| 5,434,512 | 7/1995 | Schwindt et al. . | |
| 5,457,398 | 10/1995 | Schwindt et al. . | |

*Primary Examiner*—Vinh P. Nguyen
*Attorney, Agent, or Firm*—Pearne, Gordon, McCoy & Granger LLP

[57] ABSTRACT

A semiconductor probe card is provided with low dielectric absorption feed-through contacts to isolate test lines from printed circuit board leakage effects.

4 Claims, 3 Drawing Sheets

SEMICONDUCTOR PROBE CARD FOR LOW CURRENT MEASUREMENTS

BACKGROUND OF THE INVENTION

The invention relates to the field of semiconductor testing equipment and, in particular, to probe cards for semiconductor test equipment.

U.S. Pat. No. 4,983,907 shows a prior art probe card, and is incorporated herein in its entirety by reference. This card is intended for alternating current tests. It is unsuitable for very low current direct current tests, because charge carriers can move into (and out of) the dielectric material of the printed circuit boards from the traces carrying the test signals, resulting in incorrect measurements and/or excessive measurement times. For example, when currents smaller than $10^{-12}$ amperes are involved, the dielectric absorption of the typical glass-epoxy circuit board is sufficient to throw off measurements and to require settling times of as much as one-half hour.

Materials such as tetrafluoroethylene (e.g., Teflon) have a much lower dielectric absorption, but cost and mechanical considerations make it impractical to make circuit boards out of such materials.

SUMMARY OF THE INVENTION

A probe card for providing an electrical interface between a plurality of test lines and a device under test includes a contact board having a plurality of feed-through contacts therethrough. The contacts include a conductive pin surrounded longitudinally by an electrically insulating material sheathed in a conductive material. The pin has a first and second end. The test lines are electrically connectable to the feed-through contacts at the first end and the conductive material sheath is connectable to a reference voltage. It further includes, a probe board attached to the contact board. The probe board has a plurality of contact probes mounted on said probe board for contacting the device under test. Each probe has an electrical connection terminal, the connection terminal being connected by a wire to at least one of the feed-through contacts at the second end.

The card is used for connecting a measurement device having a plurality of test lines to a device under test to allow the utilization of currents of less than $10^{-12}$ amperes in the measurement of electrical parameters by connecting the probe card between said measurement device and the device under test.

DESCRIPTION OF THE PREFERRED EMBODIMENTS

Figure 1:
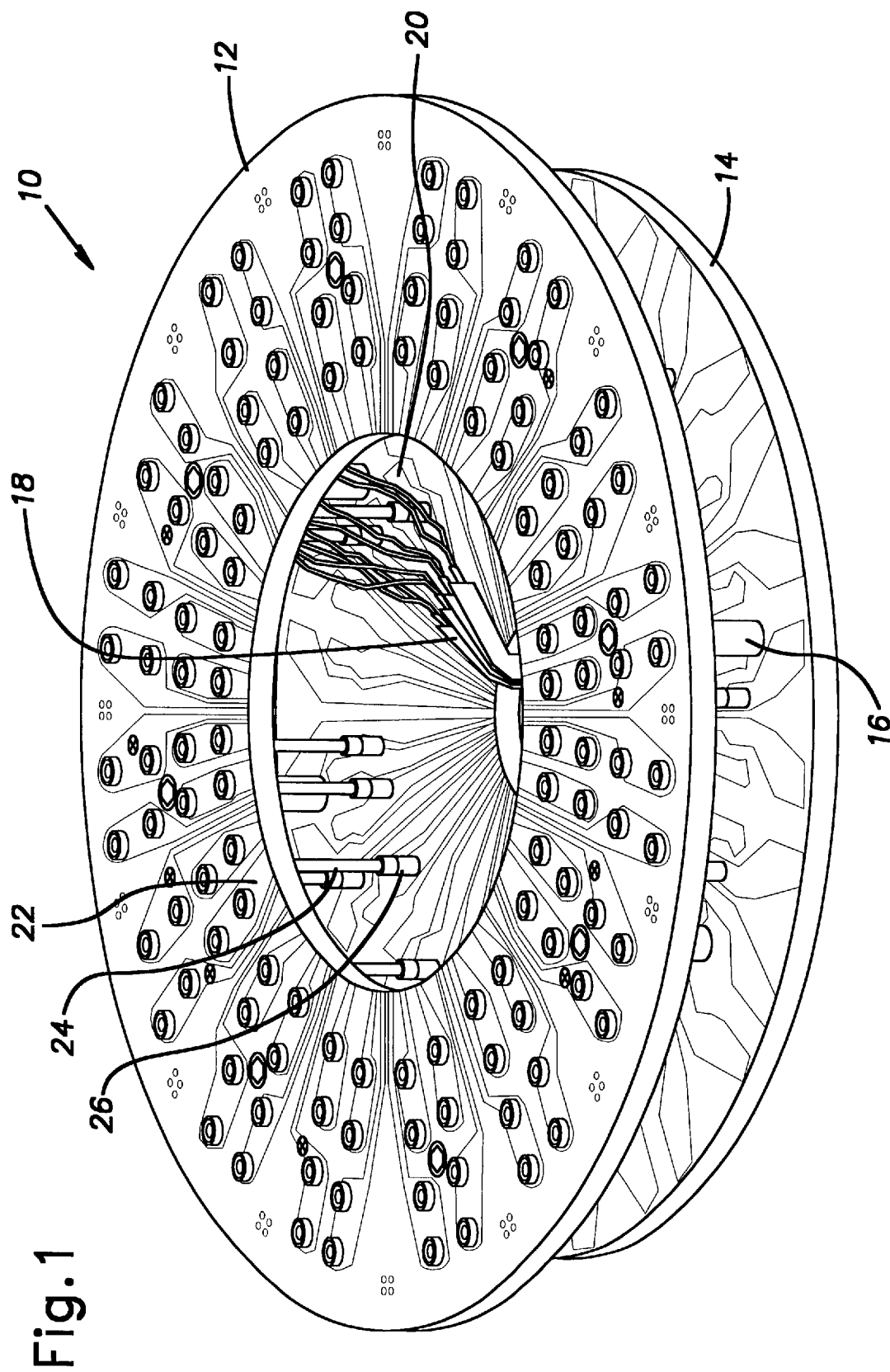
FIG. 1 is a perspective view of a probe card according to the invention.
Figure 2:
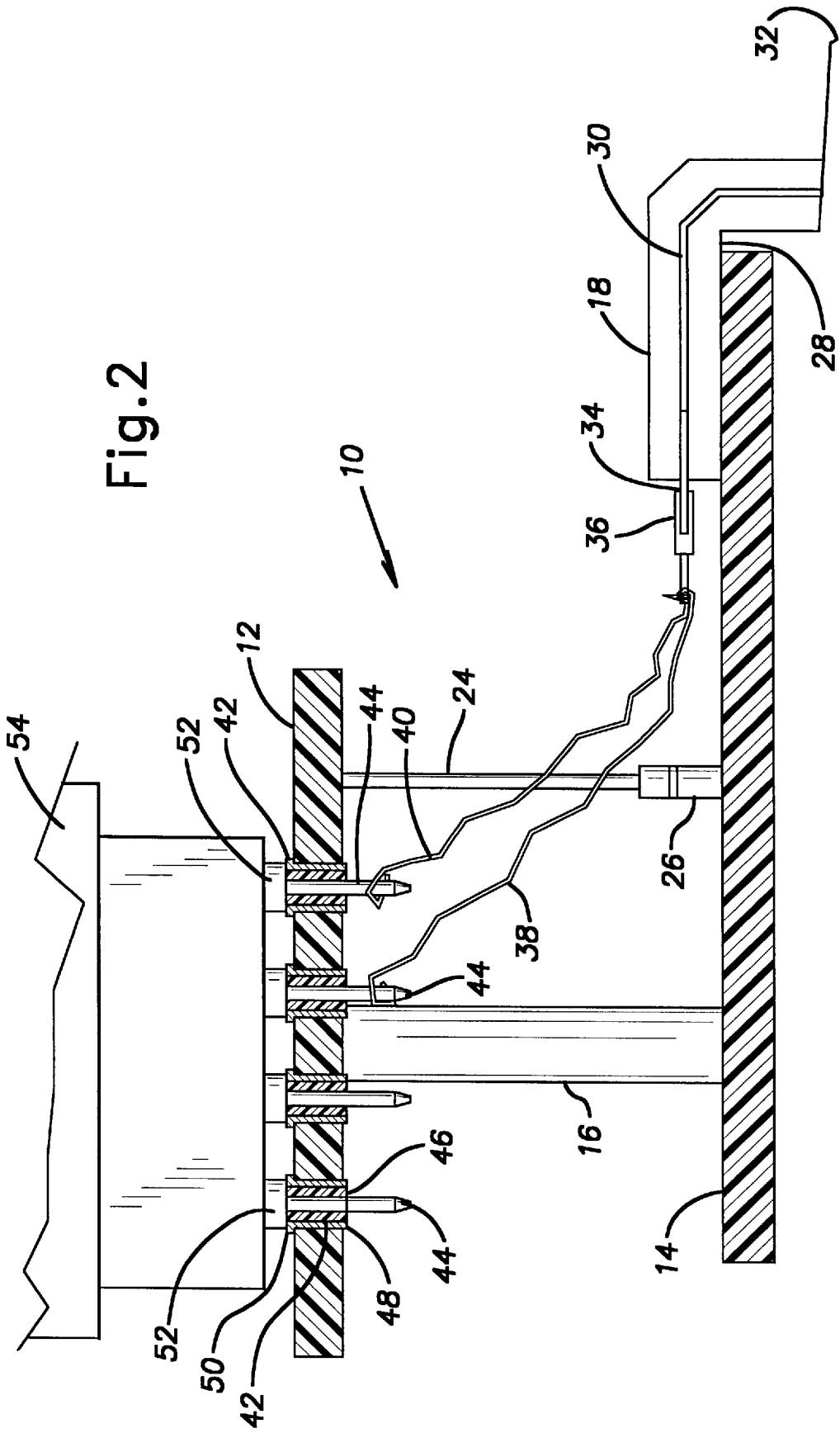
FIG. 2 is an enlarged cross sectional side elevational view of a portion of a probe card according to the invention.

Referring to FIGS. 1 and 2, a probe card 10 is formed from a contact board 12 and a probe board 14. The boards 12, 14 are structurally attached to each other by a series of spacers 16 and are each in the form of a printed circuit board (e.g., glass-epoxy boards with electrically conductive gold traces).

Ceramic blade probes 18 are attached to guard traces 20 on the probe board 14. The guard traces 20 on the probe board 14 are electrically connected to guard traces 22 on the contact board 12 by the mating of a pin 24 on the contact board 12 and a socket 26 on the probe board 14.

The ceramic blade probes 18 are covered on one side (opposite the side shown in FIG. 2) and on the mounting edge 28 by a conductive material. The mounting edge 28 is soldered to the guard traces 20 to provide both an electrical and structural connection. The other side of the probes 18 have a signal conductor 30 terminating in a needle tip 32. The needle tip 32 is used to make contact with an unshown device under test. The blade probes 18 may be, for example, microstrip ceramic blade probes manufactured by Cerprobe Corporation of Tempe, Ariz.

In the preferred embodiment, a pin 34 is soldered to the signal conductor 30 to removably mate with a socket 36 soldered to one or more wires 38, 40 to be connected to the blade probe 18. For example, the wire 38 may be a "force" connection between the test equipment and the device under test and the wire 40 may be a "sense" connection between the test equipment and the device under test.

The pin and sockets 34, 36 and the pin and sockets 24, 26 provide a convenient way to separate the boards 12, 14 to allow the desired placement of blade probes 18 for a particular application.

Figure 3:
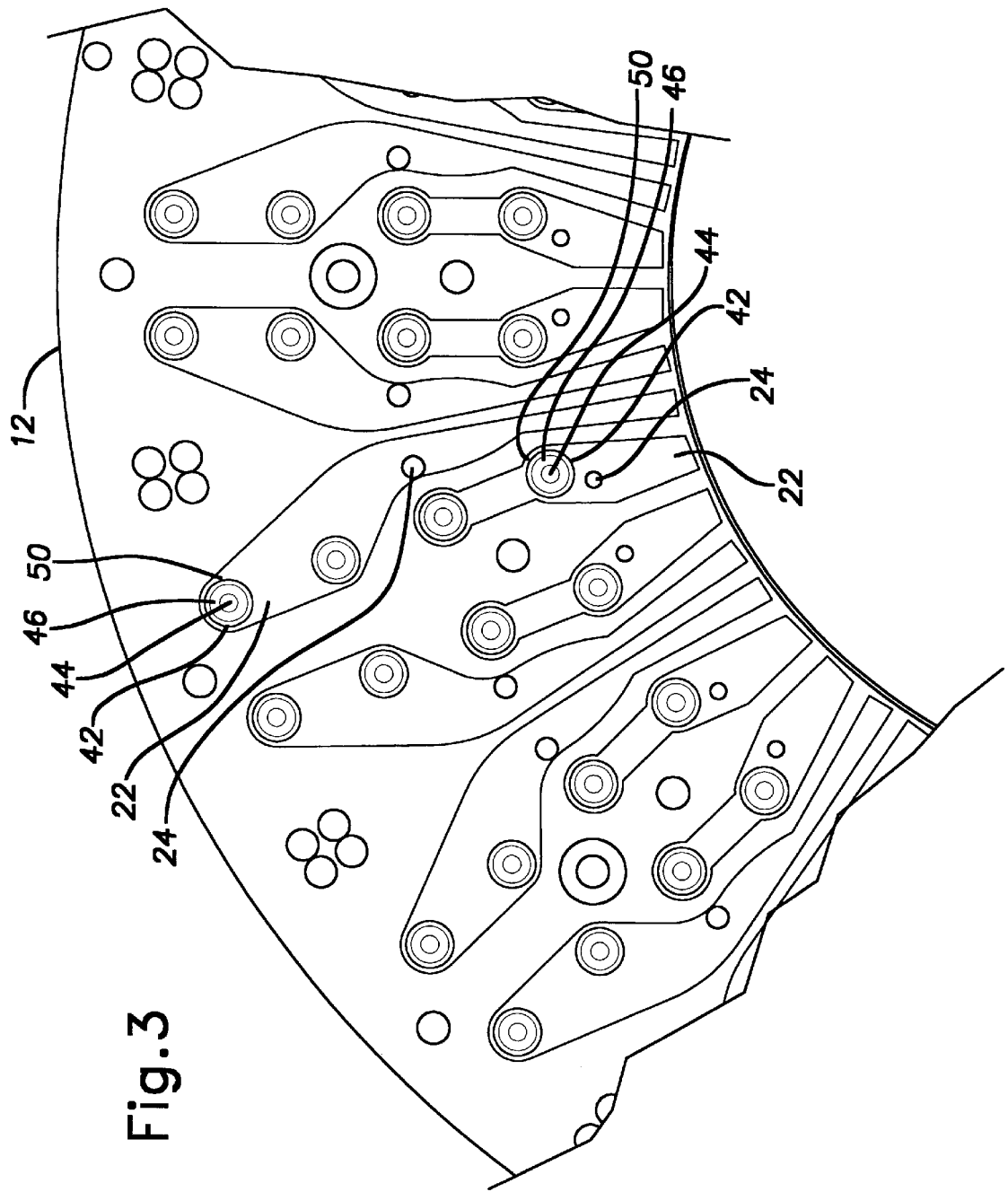
FIG. 3 is an enlarged top plan view of a portion of a contact board according to the invention.

Referring to FIGS. 2 and 3, coaxial feed-through contacts 42 mounted into holes in the contact board 12. In the preferred embodiment, the holes in the contact board are plated through as part of the guard traces 22 and the feed-through contacts 42 are press-fit into the board 12.

Each feed-through contact 42 includes a conductive pin 44 surrounded by a low dielectric absorption material 46. The material 46 may be, for example, tetrafluoroethylene (e.g., Teflon). In the preferred embodiment, each feed-through contact 42 is surrounded by its own coaxial conductive sheath 48, but it is possible to rely on the plated through holes of the traces 22 to function as the conductive sheath about the material 46.

The wires 38, 40 are connected to the desired pins 44. The wires may be, for example, soldered to the pins.

In the preferred embodiment, the sheath 48 has a collar 50 that prevents over-insertion of the feed-through contact 42 into the contact board 12. The collar 50 also provides a contact surface when the probe card 10 is used with coaxial "pogo" pins 52.

The pogo pins 52 are spring-loaded contacts that bring the test lines from the measurement device 54 to the probe card 10. The pogo pins 52 may be, for example, coaxial contacts having an inner conductor (unshown) that contacts the top of the pin 44 and an outer conductor that contacts the top of the collar 50.

In use, the probe card 10 is connected between the measurement device 54 and the device under test. The guard traces 20, 22 are connected by the outer conductor of respective pogo pins 52 to circuitry in the device 54 that forces the potential of the guards to a desired reference voltage. The inner conductor of the pogo pin 52 connects a desired sense or force test line to a respective pin 44 and, ultimately, to the a respective needle tip 32.

The use of the feed-through contacts 42 completely isolates the test lines from the circuit boards 12, 14. This allows the measurement of electrical parameters involving currents of less than $10^{-12}$ amperes. Settling times between measurements can often be reduced to less than a minute.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A probe card for providing an electrical interface between a plurality of test lines and a device under test, comprising a contact board having a plurality of feed-through contacts therethrough, said contacts comprising a conductive pin surrounded longitudinally by an electrically insulating material sheathed in a conductive material, said pin having first and second ends and said test lines being electrically connectable to said feed-through contacts at the first end and said conductive material sheath being connectable to a guard reference voltage; and a probe board attached to said contact board and having a plurality of contact probes mounted on said probe board for contacting said device under test, each probe having an electrical connection terminal, said connection terminal being connected by a wire to at least one of said feed-through contacts at the second end.

2. A probe card according to claim 1, wherein said electrically insulating material is tetrafluoroethylene.

3. A probe card according to claim 1, wherein said electrical connection terminal and said wire are connected by a pin and socket connector.

4. A method for connecting a measurement device having a plurality of test lines to a device under test to allow the utilization of currents of less than $10^{-12}$ amperes in the measurement of electrical parameters, comprising:

providing a probe card having:

a contact board having a plurality of feed-through contacts therethrough, said contacts comprising a conductive pin surrounded longitudinally by an electrically insulating material sheathed in a conductive material, said pin having first and second ends and said test lines being electrically connectable to said feed-through contacts at the first end and said conductive material sheath being connectable to a guard reference voltage; and a probe board attached to said contact board and having a plurality of contact probes mounted on said probe board for contacting said device under test, each probe having an electrical connection terminal, said connection terminal being connected by a wire to at least one of said feed-through contacts at the second end; and connecting said probe card between said measurement device and said device under test.

\* \* \* \* \*

UNITED STATES PATENT AND TRADEMARK OFFICE
CERTIFICATE OF CORRECTION

PATENT NO. : 5,808,475
DATED : September 15, 1998
INVENTOR(S) : William Knauer et al.

It is certified that error appears in the above-identified patent and that said Letters Patent is hereby corrected as shown below:

Column 3, line 13

(Claim 1), after "therethrough," insert --each of--.

Column 4, line 10

(Claim 4), after "therethrough," insert --each of--.

Signed and Sealed this

Twelfth Day of January, 1999

Attest:

Attesting Officer

*Acting Commissioner of Patents and Trademarks*